United States Patent
Hsu et al.

(10) Patent No.: US 8,875,067 B2
(45) Date of Patent: Oct. 28, 2014

(54) REUSABLE CUT MASK FOR MULTIPLE LAYERS

(71) Applicant: Taiwan Semiconductor Manufacturing Co., Ltd., Hsin-Chu (TW)

(72) Inventors: Chin-Hsiung Hsu, Guanyin Township (TW); Huang-Yu Chen, Zhudong Township (TW); Yuan-Te Hou, Hsinchu (TW); Wen-Hao Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/893,424

(22) Filed: May 14, 2013

(65) Prior Publication Data

US 2014/0282287 A1 Sep. 18, 2014

Related U.S. Application Data

(60) Provisional application No. 61/787,880, filed on Mar. 15, 2013.

(51) Int. Cl.
*G06F 17/50* (2006.01)

(52) U.S. Cl.
CPC .................................. *G06F 17/5081* (2013.01)
USPC .................................. 716/54; 716/51; 716/55

(58) Field of Classification Search
USPC ................................................. 716/51, 54–55
See application file for complete search history.

(56) References Cited

U.S. PATENT DOCUMENTS

| | | | | |
|---|---|---|---|---|
| 5,766,806 | A * | 6/1998 | Spence | 430/5 |
| 7,473,648 | B2 * | 1/2009 | Brunner et al. | 438/717 |
| 7,569,308 | B2 * | 8/2009 | Wang et al. | 430/5 |
| 7,759,235 | B2 * | 7/2010 | Zhuang et al. | 438/587 |
| 8,051,390 | B2 * | 11/2011 | Frederick et al. | 716/54 |
| 8,312,394 | B2 * | 11/2012 | Ban et al. | 716/50 |
| 8,667,443 | B2 * | 3/2014 | Smayling et al. | 716/119 |
| 2007/0178710 | A1 * | 8/2007 | Muyres et al. | 438/778 |
| 2008/0222587 | A1 * | 9/2008 | Smayling et al. | 716/7 |
| 2010/0088659 | A1 * | 4/2010 | Frederick et al. | 716/5 |
| 2011/0004858 | A1 * | 1/2011 | Chang et al. | 716/122 |
| 2011/0095338 | A1 * | 4/2011 | Scheuerlein et al. | 257/202 |
| 2011/0195348 | A1 * | 8/2011 | Lo et al. | 430/5 |
| 2012/0045901 | A1 * | 2/2012 | Kim et al. | 438/703 |
| 2014/0051016 | A1 * | 2/2014 | Chiou et al. | 430/5 |

* cited by examiner

*Primary Examiner* — Naum B Levin
(74) *Attorney, Agent, or Firm* — Eschweiler & Associates, LLC

(57) ABSTRACT

The present disclosure relates to a method of forming a reusable cut mask or trim mask that can be used for multiple design levels, and an associated apparatus. In some embodiments, the method is performed by determining positions of a plurality of mask cuts for a reusable cut mask or a reusable trim mask. Shapes are then routed along a routing path having a plurality of design levels. The routing path intersects one or more of the plurality of mask cuts at positions that form distinct shapes that connect nodes of an integrated chip sharing a same electric network. By routing shapes on a plurality of design levels to intersect one or more of the plurality of mask cuts, the cut masks can be reused between the plurality of levels, therefore decreasing mask costs during fabrication.

20 Claims, 8 Drawing Sheets

US 8,875,067 B2

REUSABLE CUT MASK FOR MULTIPLE LAYERS

REFERENCE TO RELATED APPLICATIONS

This application claims priority to U.S. Provisional Patent Application Ser. No. 61/787,880 filed on Mar. 15, 2013, entitled "Reusable Cut Mask For Multiple Layers", which is hereby incorporated in its entirety.

BACKGROUND

To improve the functionality of integrated chips, the semiconductor industry has continually increased the number of transistors that are on an integrated chip. To achieve a larger number of transistors on an integrated chip, without substantially increasing a size of the integrated chip, the semiconductor industry has continually reduced the minimum feature size of integrated chip components. For example, the minimum gate width of a transistor has been reduced from tens of microns in the 1980s to tens of nanometers in advanced technology nodes (e.g., in 22 nm nodes, 16 nm nodes, etc.).

However, next generation lithographic exposure tools have failed to keep pace with the demand for shrinking, and integrated chips in advanced technology nodes have minimum feature sizes that are far less than the wavelength of radiation used in lithographic exposure tools. Therefore, to achieve small minimum feature sizes, lithographic exposure tools have been forced to use tricks to reduce the minimum feature sizes. Double-patterning lithography (DPL) has emerged as one of the most promising solutions to continue scaling in advanced processing nodes.

DETAILED DESCRIPTION

Figure 1:
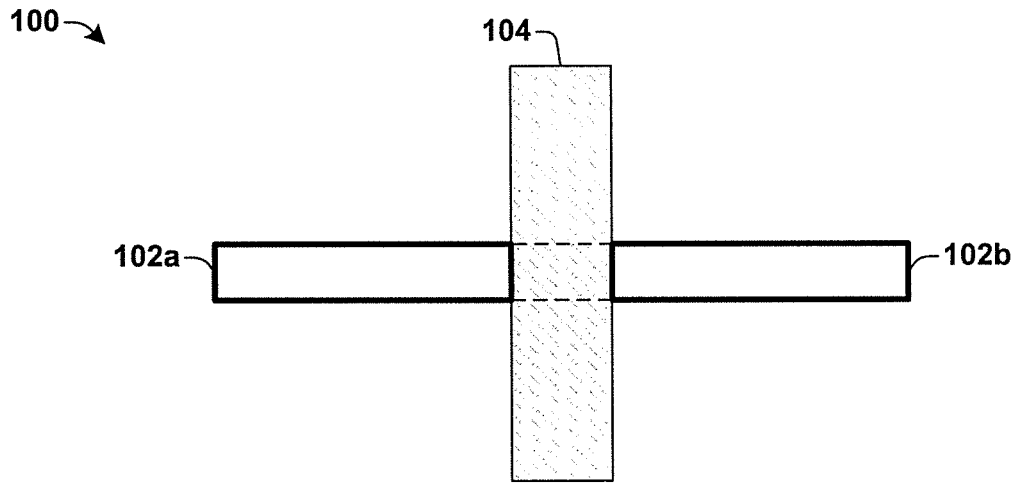
FIG. 1 illustrates an example of a cut mask lithography process that 'cuts' a space between shapes using a cut mask.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

One type of double exposure technique that has become widely used is cut mask lithography processes. FIG. 1 illustrates an example of a cut mask lithography process that 'cuts' a shape 102 using a cut mask 104. The shape 102 is typical formed by a first photolithography exposure process that uses a first photomask to selectively expose a photoresist material. A second cut mask is then exposed with a second photolithography exposure to define gaps in the shape 102 (i.e., 'cuts' in the lines). The gaps "cut" shape 102 into separate shapes, 102a and 102b, which can be subsequently transferred to a semiconductor wafer. By using a cut mask 104 to form spaces between shapes 102a and 102b, a smaller spacing can be achieved than that possible using a single mask.

Cut mask lithography processes typically form a cut mask having mask cuts that are positioned in a pattern according to a layout of an integrated chip design. For example, metal wires of a design level may be laid out in a GDS file and subsequently positions of mask cuts may be determined to form spaces between the metal wires. While this method provides for a high degree of freedom on the design levels, it uses separate cuts masks for each design level. For example, a first cut mask for a first design level has mask cuts located at a first plurality of positions, while a second cut mask for a second design level has mask cuts located at a second plurality of positions that are different than those of the first cut mask. It has been appreciated that the use of separate cut masks for each design level drives high mask costs during fabrication.

Accordingly, the present disclosure relates to a method of forming a reusable cut mask or trim mask that can be used for multiple design levels, and an associated apparatus. In some embodiments, the method comprises determining positions of a plurality of mask cuts for a reusable cut mask or a reusable trim mask. Shapes are then routed along a routing path having a plurality of design levels. The routing path intersects one or more of the plurality of mask cuts at positions that form distinct shapes configured to connect nodes of an integrated chip sharing a same electric network. By routing shapes along a routing path, having a plurality of design levels, to intersect one or more of the plurality of mask cuts, the cut masks can be reused between the plurality of design levels, therefore decreasing mask costs during fabrication.

Figure 2:
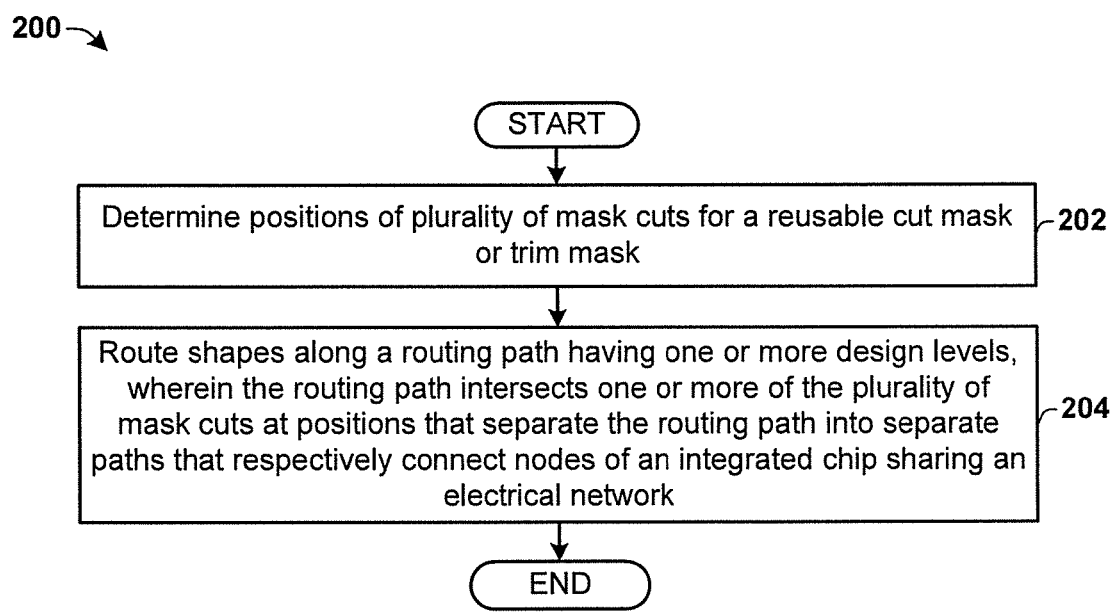
FIG. 2 illustrates a flow chart of some embodiments of a method of generating data for mask sets having a reusable cut mask or a reusable trim mask on a plurality of design levels.

FIG. 2 illustrates a flow diagram of some embodiments of a method 200 of generating data for mask sets having a reusable cut mask or a reusable trim mask on a plurality of design levels.

At 202, positions of a plurality of mask cuts are determined for a reusable cut mask or a reusable trim mask.

At 204, shapes are routed along a routing path having one or more design levels, wherein the routing path intersects one or more of the plurality of mask cuts at positions that separate the routing path into separate paths that respectively distinct wires configured to connected nodes sharing an electrical network. For example, shapes may be routed along a routing path having a first design level, a second design level, etc. In some embodiments, shapes on the first design level may intersect one or more of the plurality of mask cuts to form distinct wires that connect a same electrical network. In other embodiments, shapes on a second design level may intersect one or more of the plurality of mask cuts to form distinct wires that connect a same electrical network. By routing shapes along a routing path that intersect one or more of the plurality of mask cuts, the mask cuts are not positioned relative to shapes on a design level, but rather shapes on the design level are positioned relative to one or more of the plurality of mask cuts. This allows for the cut masks to be reused between the plurality of design levels.

In some embodiments, a routing path may comprise a metal line extending over multiple electrical networks and having a length that meets design rules (e.g., a minimum area design rule). The plurality of mask cuts are configured to remove a part of the metal line to form two disconnected metal lines respectively associated with separate electrical networks. For example, a metal line may be routed between two signal points $s_{a1}$ and $s_{a2}$ having a first electrical network and two signal points $s_{b1}$ and $s_{b2}$ having a second electrical network. Since using a first metal line to connect $s_{a1}$ and $s_{a2}$ and a separate metal line to connect $s_{b1}$ and $s_{b2}$ will violate minimum length design rules, a single metal line may be designed to connect $s_{a1}$, $s_{a2}$, $s_{b1}$, and $s_{b2}$ along a routing path that intersects a mask cut.

Figure 3:
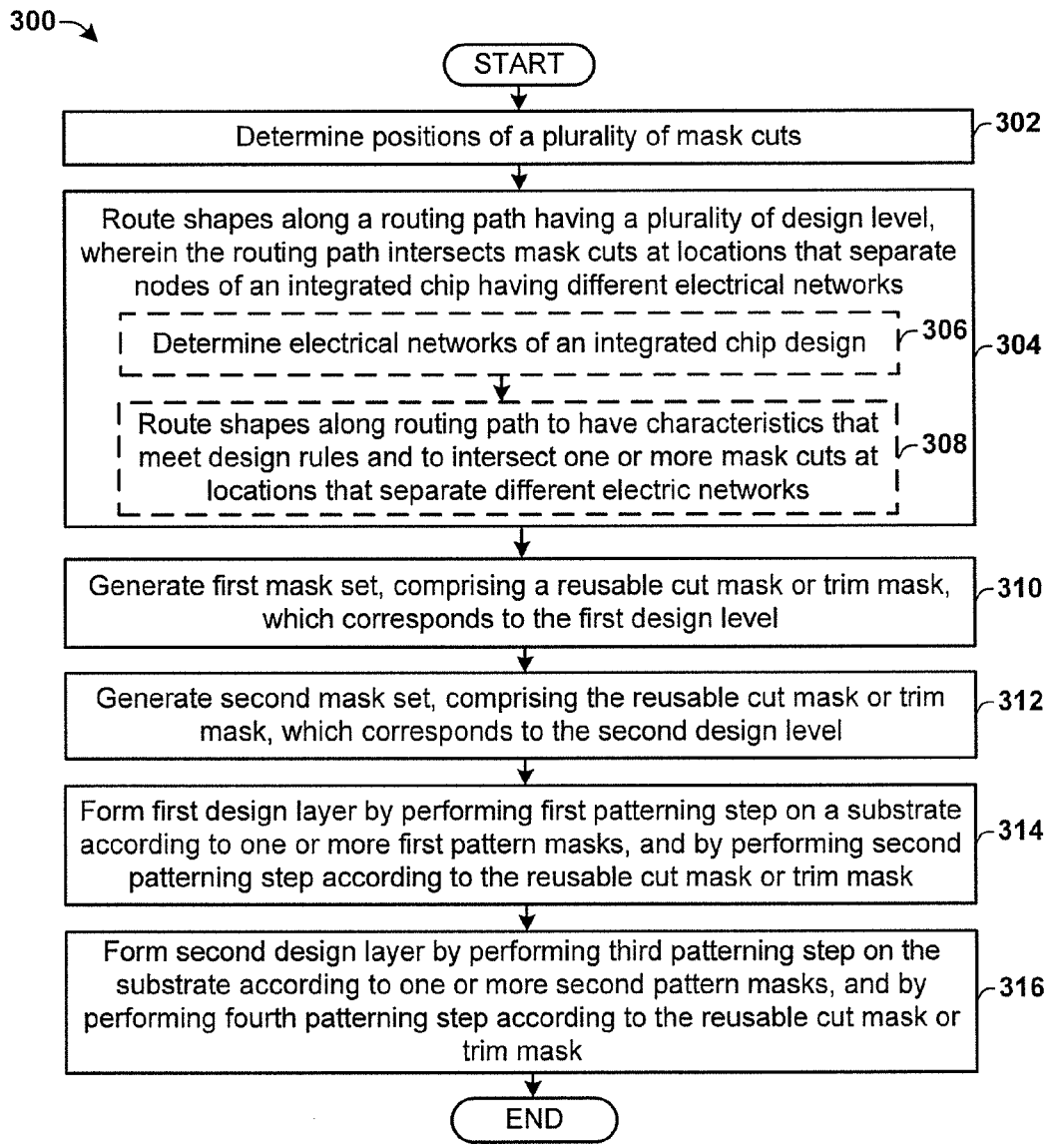
FIG. 3 illustrates a flow chart of some embodiments of a method of forming two design levels using a reusable cut mask.

FIG. 3 illustrates a flow chart of some embodiments of a method 300 of forming two design levels using a reusable cut mask.

At 302, positions of a plurality of mask cuts are determined. The plurality of mask cuts correspond to areas of multiple design levels that are removed to form spaces between shapes of the design levels.

At 304, shapes are routed along a routing path having a plurality of design levels, wherein the routing path is configured to intersect one or more of the plurality of mask cuts at a location between nodes having different electrical networks. In other words, the routing path is configured to intersect one or more of the plurality of mask cuts at positions that separate the routing path into distinct routing paths that connect nodes having a same electrical network. In various embodiments, the routing path may comprise shapes on the first design level that intersect one or more of the plurality of mask cuts at positions that correspond to end-to-end line spaces of the first design level or shapes on the second design level that intersect one or more of the plurality of mask cuts at positions that correspond to end-to-end line spaces of the second design level.

In some embodiments, the method 300 may determine electrical networks of a design, at 306. For example, the method may determine electrical networks of one or more semiconductor devices. At 308, shapes are routed along a routing path having characteristics that meet design rules and that intersect one or more mask cuts at positions that separate the routing path into distinct paths associated with an electric network. By routing shapes along a routing path that intersects one or more of the plurality of mask cuts on different design levels, the same mask cuts can be used for the plurality of design levels and therefore a reusable cut mask can be used for the plurality of design levels.

At 310, a first mask set comprising a reusable cut mask or trim mask is formed for a first design level. The reusable cut mask or trim mask is formed using the mask cut data generated at 302. The first mask set may further comprise one or more additional pattern masks formed from the shape data corresponding to a first design level of the plurality of design levels generated at 304.

At 312, a second mask set comprising the reusable cut mask or trim mask is formed for a second design level. The reusable cut mask or trim mask comprises the same reusable cut mask or trim mask used in the first mask set. The second mask set may further comprise one or more additional pattern masks formed from the shape data corresponding to a seconding design level of the plurality of design levels generated at 304.

At 314, a first design level is formed by performing a first photolithography patterning step on a substrate according to one or more pattern masks of the first mask set and subsequently performing a second photolithography patterning step on the substrate according to the reusable cut mask or trim mask.

At 316, a second design level is formed by performing a third photolithography patterning step on the substrate according to one or more pattern masks of the second mask set and subsequently performing a fourth photolithography patterning step on the substrate according to the reusable cut mask or trim mask.

Figure 4A:
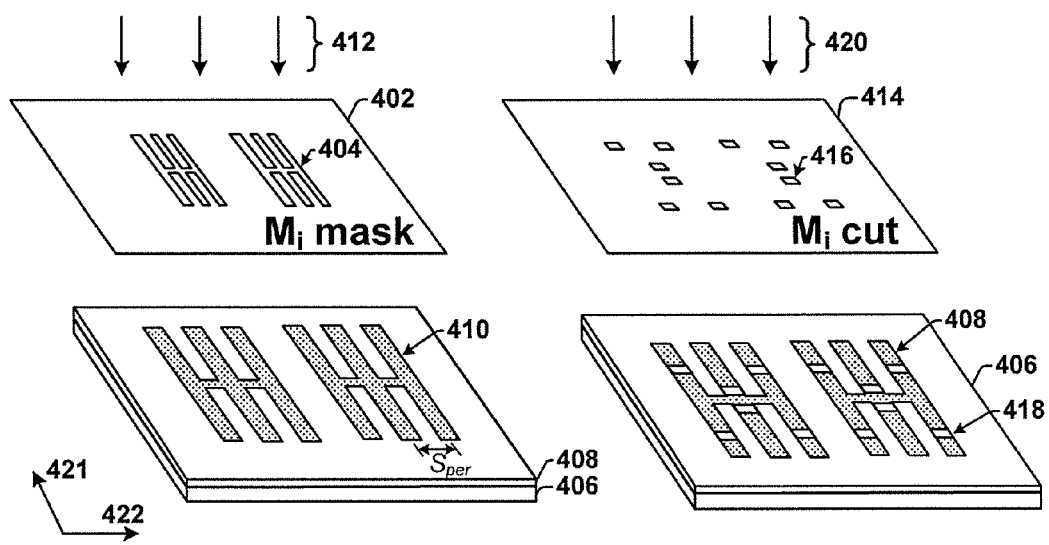
FIGS. 4A-4B illustrate block diagrams showing some embodiments of the formation of two design levels according to the method of FIG. 3.
Figure 4B:
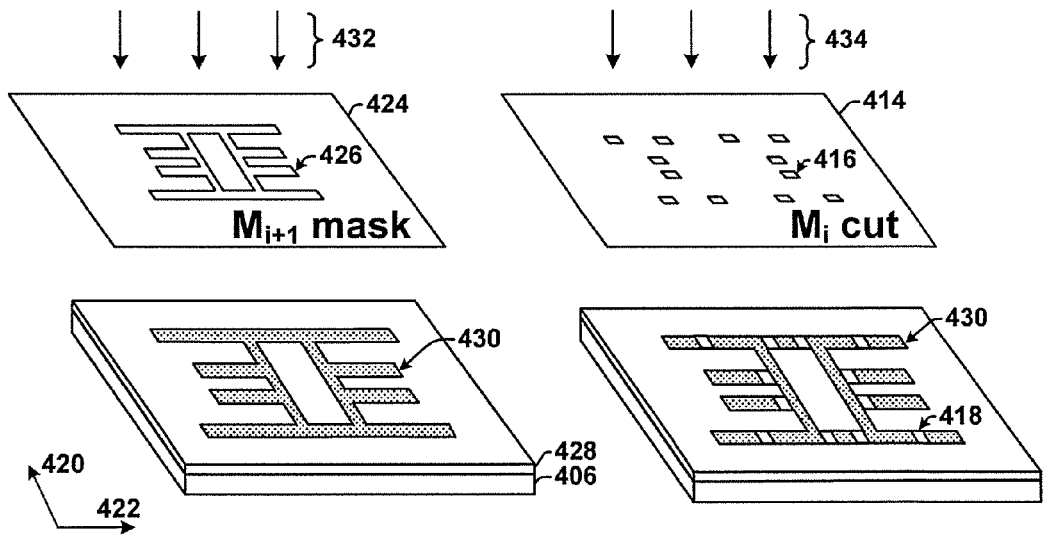

FIGS. 4A and 4B illustrate some embodiments of diagrams showing lithographic exposures of a first design level and a second design level using a reusable cut mask. Although the masks shown in FIGS. 4A and 4B are illustrated as having openings that are similar to the shapes formed on the substrate, it will be appreciated that the mask openings are illustrated as non-limiting simplifications of actual mask openings for explanatory purposes. Actual mask openings may comprise mask reticle enhancement features (e.g., OPC features configured to mitigate line end shorting, corner rounding, etc.), which cause the mask openings to differ from the shapes formed on the substrate.

FIG. 4A illustrates some embodiments of lithographic exposures of a substrate 406 using a first mask set comprising a first pattern mask 402 and a reusable cut mask 414 for a first design level.

The first pattern mask 402 comprises a plurality of mask openings 404. During a first photolithography exposure step, electromagnetic radiation 412 is applied to the first pattern mask 402. In some embodiments, the electromagnetic radiation 412 may comprise ultra-violet radiation (e.g., having a wavelength of 193 nm). The electromagnetic radiation 412 selectively changes the chemical composition of a photoresist layer 408 disposed on the substrate 406 to form the shapes 410 within the photoresist layer 408. In some embodiments, the photoresist layer 408 may comprise a positive tone photoresist, such that exposed areas of the photoresist layer become soluble upon being exposed.

In some embodiments, the shapes 410 may comprise lines that are separated by periodic spaces $S_{per}$ (i.e., lines that are formed along a multiple of a fixed pitch). For example, the shapes 410 may comprise multiple parallel metal lines are formed to extend along a first direction 421 at periodic spaces $S_{per}$ that are equal to a minimum spacing of the metal lines. By forming the shapes 410 at periodic spaces, a lithography exposure tool can be tuned to improve the lithographic resolution of the shapes 410.

The reusable cut mask 414 comprises a plurality of mask cuts 416. One or more of the plurality of mask cuts 416 are disposed at locations that intersect the shapes 410 at positions of spaces between the shapes 410. During a second photolithography exposure step, electromagnetic radiation 420 (e.g., ultra-violet radiation) is applied to the reusable cut mask 414. The electromagnetic radiation 420 operates to form spaces 418 between the shapes 410 by removing unwanted area of the shapes 410 formed by the first pattern mask 402.

FIG. 4B illustrates some embodiments of lithographic exposures of the substrate 406 using a second mask set comprising a second pattern mask 424 and the reusable cut mask 414 for a second design level.

The second pattern mask 424 comprises a plurality of mask openings 426. During a third photolithography exposure step, electromagnetic radiation 432 is applied to the second pattern mask 424. The electromagnetic radiation 432 selectively changes the chemical composition of a photoresist layer 428 on the substrate 406 to form shapes 430 within the photoresist layer 428. In some embodiments, the shapes 430 may comprise multiple parallel metal lines are formed to extend along a second direction 422.

The one or more mask cuts 416 of the reusable cut mask 414 are disposed at locations that intersect the shapes 430 at positions of spaces between the shapes 430. For example, during a fourth photolithography exposure step, electromagnetic radiation 434 (e.g., ultra-violet radiation) is applied to the reusable cut mask 414. The electromagnetic radiation 434 operates to form spaces 418 between the shapes 430 by removing unwanted area of the shapes 430 formed by the second pattern mask 424.

Figure 5A:
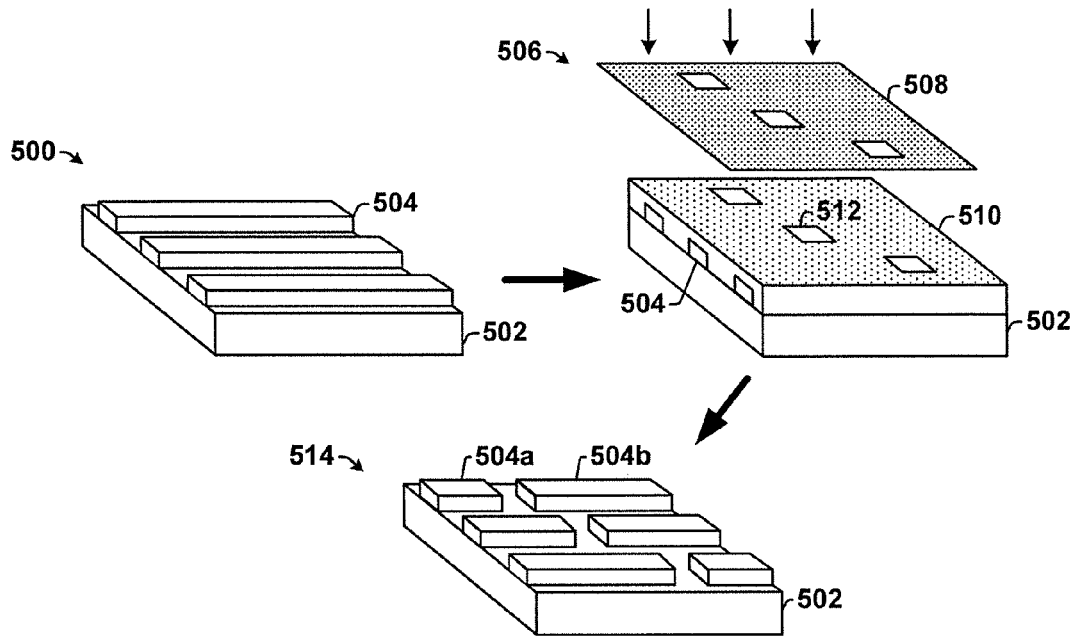
FIGS. 5A-5B illustrate diagrams showing some embodiments of the formation on-chip structures using cut masks.
Figure 5B:
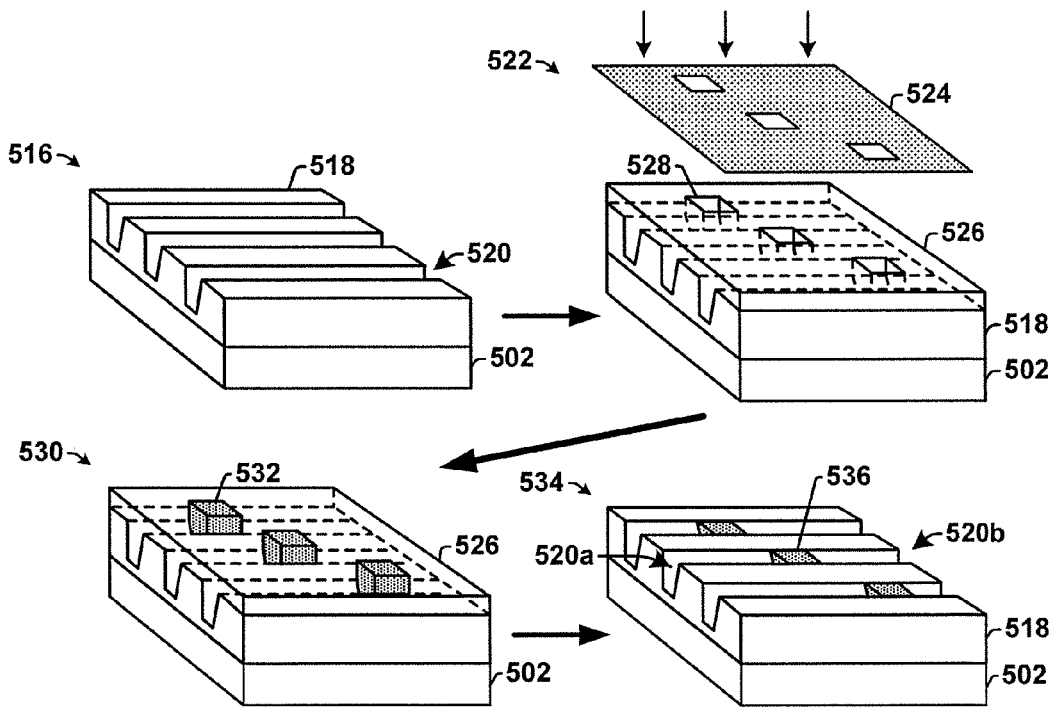

It will be appreciated that the fabrication processes used in the formation of the first design level and the second design level may vary depending upon the design level being formed. FIGS. 5A-5B illustrate some embodiments of the formation of on-chip structures for a polysilicon design level and for a metal interconnect design level using a cut mask, respectively.

Referring to FIG. 5A, three-dimensional view 500 illustrates a plurality of polysilicon gate lines 504 disposed on a substrate 502. As illustrated in three-dimensional view 506, to form spaces between the polysilicon gate lines 504, a reusable cut mask 508 is used to expose a first photoresist layer 510 disposed over the polysilicon gate lines 504, resulting in openings 512. An etching process is then used to selectively etch the polysilicon gate lines 504 according to the openings 512 in the first photoresist layer 510. The etching process, selectively cuts the polysilicon gate lines 504, as illustrated in three-dimensional view 514, to form a first polysilicon line 504a and a second polysilicon line 504b separated by a space formed by the reusable cut mask 508.

Referring to FIG. 5B, three-dimensional view 516 illustrates a plurality of trenches 520 within a dielectric layer 518 disposed on a substrate 502. The trenches 520 correspond to metal interconnect lines that are subsequently formed within the trenches 520. As illustrated in three-dimensional view 522, to form a spaces between metal interconnect lines that will be formed in the trenches 520, a reusable cut mask 524 is used to expose a second photoresist layer 526 disposed over the dielectric layer 518. An etching process is then used to selectively etch the second photoresist layer 526 to form holes 528 that extend to positions within the trenches 520. A reverse material 532 is deposited into the holes 528 to fill the trenches 520 at locations of the spaces, as illustrated in three-dimensional view 530. The second photoresist layer 526 and excess reverse material 532 are then removed, resulting in trenches 520 that have spaces 536 formed by the reusable cut mask 524 that cuts a trench 520 into a first trench 520a and a second trench 520b.

While FIG. 5B illustrates the use of a 'cut first' technique that forms special materials on mask cut positions so that metal shapes will be excluded from the cut regions, it will be appreciated that a 'cut last' technique may also be used. In a cut last technique metal shapes are formed and then etch metal in cut regions.

Figure 6:
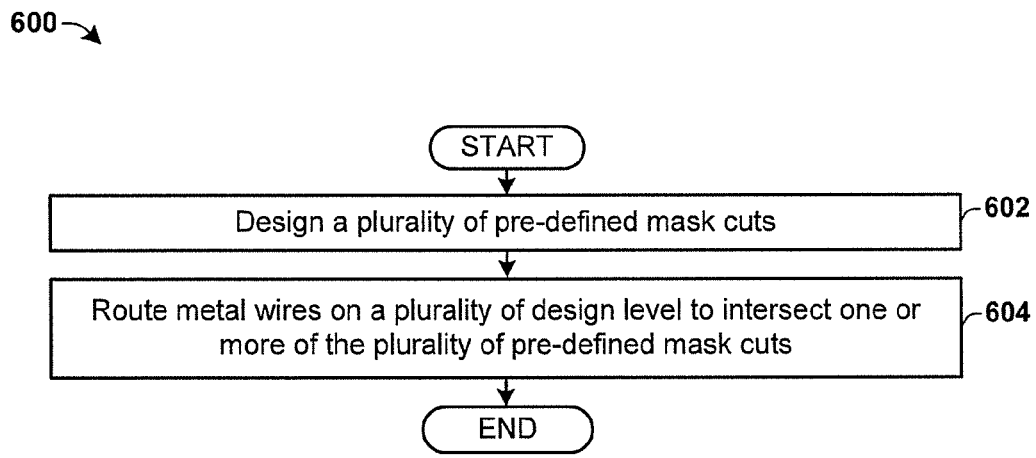
FIG. 6 illustrates a flow chart of some alternative embodiments of a method of forming a reusable cut mask.
Figure 8:
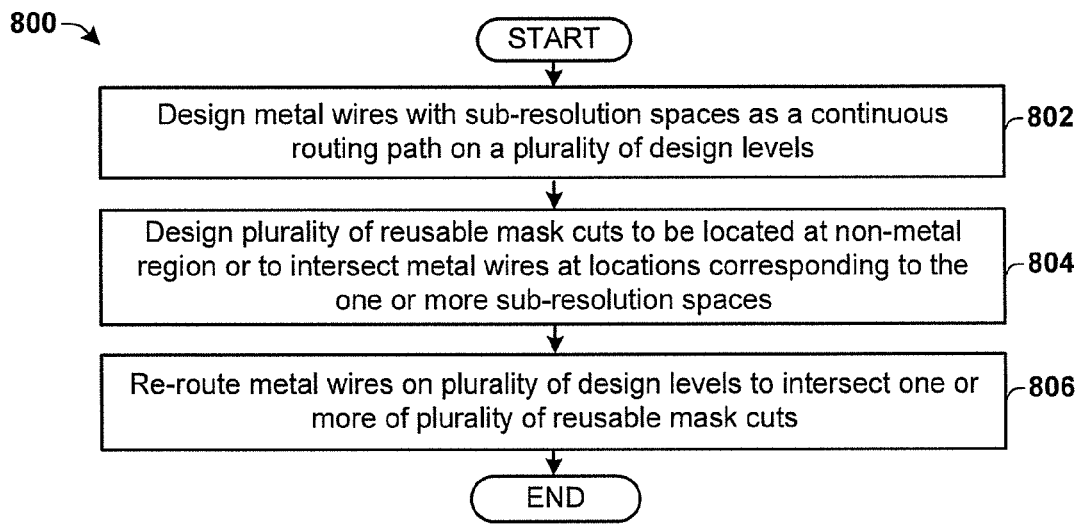
FIG. 8 illustrates a flow chart of some alternative embodiments of a method of forming a reusable cut mask.
Figure 10:
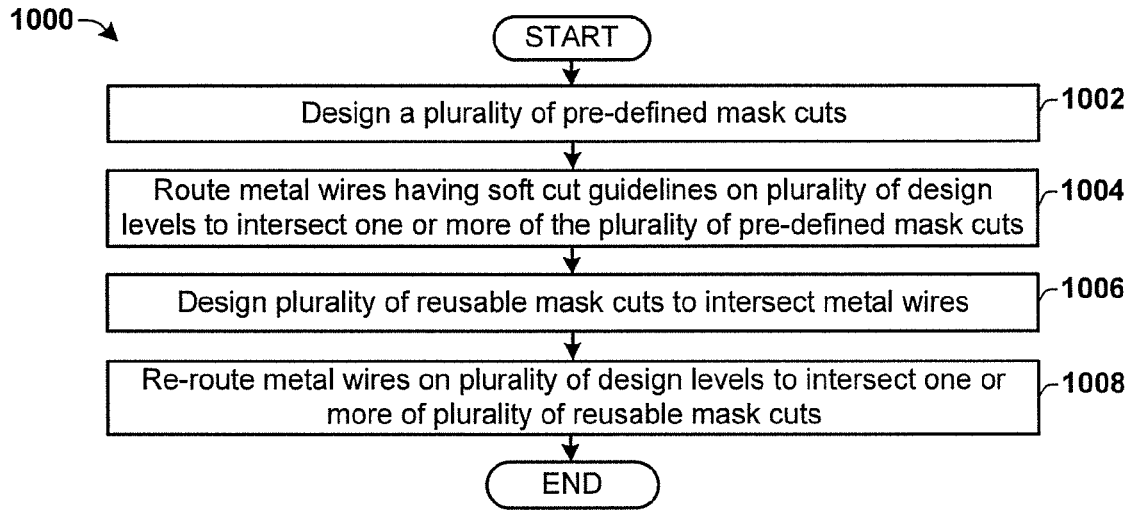
FIG. 10 illustrates a flow chart of some alternative embodiments of a method of forming a reusable cut mask.

FIGS. 6, 8, and 10 illustrate various embodiments of methods for generating a mask set comprising a reusable cut mask. Although the methods of FIGS. 6, 8, and 10 are described in relation to the formation of a cut mask, it will be appreciated that the methods may also be applied to form trim masks. Similarly, although the methods of FIGS. 6, 8, and 10 are described in relation to the formation of metal wire layers, the methods may also be applied to other design levels.

Furthermore, while the disclosed methods (e.g., method 200, 300, 600, 800, and 1000) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIG. 6 illustrates a flow diagram of some alternative embodiments of a method 600 for generating a mask set comprising a reusable cut mask.

At 602, a plurality of pre-defined mask cuts are designed. The plurality of pre-defined mask cuts are designed at pre-defined positions of an integrated chip layout (e.g., a GDS layout).

At 604, metal wires on a plurality of design levels are routed to intersect one or more of the plurality of pre-defined mask cuts. The plurality of metal wires intersect one or more of the plurality of pre-defined mask cuts at positions that correspond to end-to-end spaces between the metal wires. In some embodiments, end-to-end line spaces in different design levels are aligned at same positions so that the same pre-defined mask cuts can be used to form end-to-end spaces on the different design levels. For example, end-to-end line spaces on a first metal layer and a second metal layer may align at a position corresponding to a same one of the plurality of mask cuts. By routing the plurality of metal wires to intersect one or more pre-defined mask cuts, small end-to-end line spaces can be achieved with a reusable cut mask.

Figure 7:
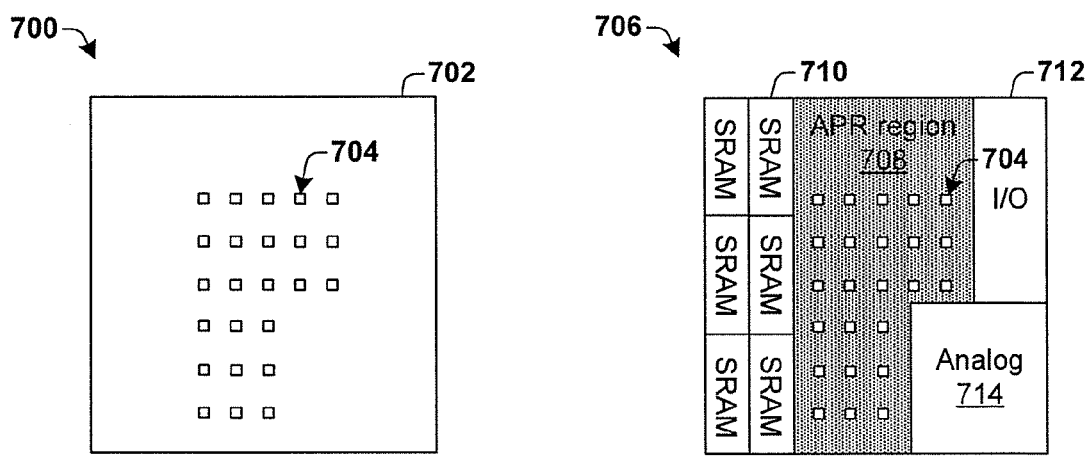
FIG. 7 illustrates some embodiments of IC layouts illustrating the formation of a reusable cut mask.

FIG. 7 illustrates some embodiments of top views, 700 and 706, of an integrated chip layout according to method 600.

As illustrated in top view 700, a plurality of pre-defined mask cuts 704 are designed within a design space 702 corresponding to a cut mask. The plurality of pre-defined mask cuts 704 may be formed prior to placement of shapes within areas of design levels that the reusable cut mask will be used to form.

As illustrated in top view 706, metal wires on a plurality of design levels are routed within a design area comprising the plurality of pre-defined mask cuts 704. The metal wires are routed to intersect one or more of the plurality of predefined mask cuts 704. In some embodiments, metal wires on multiple design levels may intersect a same one of the plurality of pre-defined mask cuts 704. In locations where metal wires intersect one or more of the plurality of predefined mask cuts, a sub-resolution space (i.e., a space that is less than that which may be achieved using a single photomask) may be achieved between metal wires.

In some embodiments, the plurality of metal wires may be located within an automatic place and route region 708, wherein the plurality of metal wires are automatically routed using an auto place and route (APR) tool. In some embodiments, the auto place and route region 708 may comprise a region having metal interconnect wires configured to connect a first region, such as an SRAM region 710 to another region, such as an I/O 712 or an analog processing region 714, for example.

FIG. 8 illustrates a flow diagram of some alternative embodiments of a method 800 for generating a mask set comprising a reusable cut mask.

At 802, metal wires having sub-resolution spaces are designed as a continuous routing path on a plurality of design levels. The continuous routing path may comprise a continuous connection of metal layers that connect a plurality of electrical networks. The sub-resolution spaces are spaces that are less than that which can be achieved using a single mask. For example, if a minimum resolvable end-to-end space is equal to 40 nm, a sub-resolution space would be an end-to-end space less than 40 nm.

At 804, a plurality of reusable mask cuts are designed. In some embodiments, one or more of the plurality of reusable mask cuts are designed to intersect the continuous routing path at location that form metal wires having the sub-resolution spaces. For example, one or more of the plurality of reusable mask cuts may be designed at positions that correspond to end-to-end spaces of the metal wires having sub-resolution spaces. In other embodiments, one or more of the plurality of reusable mask cuts are designed to intersect non-metal regions of a design. The sub-resolution spaces may separate the routing path into separate paths that correspond to distinct electrical networks.

At 806, metal wires are re-routed on the plurality of design levels to intersect one or more of the reusable mask cuts. In some positions, where the reusable mask cuts are available on a given design level, the re-routed metal wires may intersect the reusable mask cuts, while in other positions the re-routed metal wires may not intersect the reusable mask cuts.

For example, after metal wires having sub-resolution spaces are routed, mask cuts corresponding to the sub-resolution spaces may be determined. Since the mask cuts may correspond to different design levels, unused mask cuts may be present on each design level. Therefore, metal wires on a design level may be re-routed to intersect mask cuts not otherwise used on the design level. In the areas where the metal wires intersect a reusable mask cut, a sub-resolution end-to-end space can be achieved. In areas where the metal wires do not intersect a reusable mask cut, the end-to-end space will be within the resolution achievable without the mask cuts.

In some embodiments, rerouting the metal wires may comprise routing metal wires in addition to those routed at 802. In some embodiments, rerouting the metal wires may additionally comprise re-routing metal wires that were originally routed at 802. By performing a first routing operation at 802 and a separate, second re-routing operation at 806, method 800 is able to achieve a sub-resolution at specific areas, while still enabling the use of a reusable cut mask to provide for a high degree of design freedom at a reduced mask cost.

Figure 9:
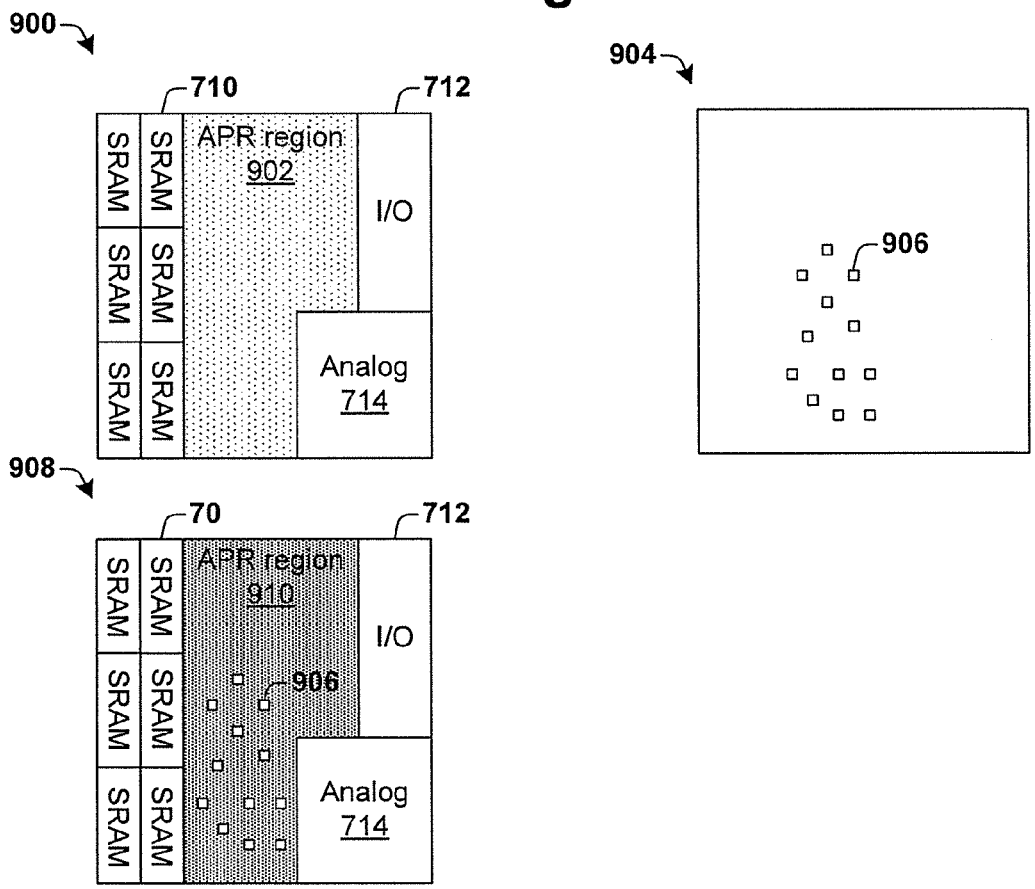
FIG. 9 illustrates some embodiments of IC layouts illustrating the formation of a reusable cut mask.

FIG. 9 illustrates some embodiments of top views, 900, 904, and 908, of an integrated chip layout according to method 800.

As illustrated in top view 900, metal wires on a plurality of design levels are routed within a design area 902. The metal wires comprise metal wires having end-to-end spaces that are sub-resolution. In some embodiments, the metal wires may be designed using an automatic place and route (APR) tool.

As illustrated in top view 904, a plurality of reusable mask cuts 906 are designed within a design space corresponding to the design area 902. One or more of the plurality of reusable mask cuts 906 are designed at locations that intersect the metal wires so as to achieve the sub-resolution spaces. In some embodiments, the plurality of reusable mask cuts 906 may comprise additional mask cuts that are designed at locations that do not intersect the first plurality of metal wires.

As illustrated in top view 908, metal wires on the plurality of design levels are re-routed within design area 910. The metal wires are re-routed to intersect one or more of the plurality of reusable mask cuts 906. In the areas where the re-routed metal wires intersect reusable mask cuts 906, sub-resolution spacing can be achieved. In areas where the re-routed metal wires do not intersect reusable mask cuts 906, the metal line spacing will be within the resolution achievable without the mask cuts.

FIG. 10 illustrates a flow diagram of some embodiments of an additional method 1000 for generating a mask set comprising a reusable cut mask.

At 1002, a plurality of pre-defined mask cuts are designed on a plurality of design levels. The plurality of pre-defined mask cuts are designed at pre-defined positions of an integrated chip layout.

At 1004, metal wires on a plurality of design levels are routed to attempt to intersect one or more of the plurality of pre-defined mask cuts. Metal wires that do intersect pre-defined mask cuts have end-to-end spaces with sub-resolution end-to-end spaces.

At 1006, a plurality of reusable mask cuts are designed. In some embodiments, the plurality of reusable mask cuts are designed at positions that corresponds to sub-resolution end-to-end spaces that were not achieved at 1004. In other embodiments, the plurality of reusable mask cuts are designed at positions do not intersect metal lines routed at 1004. In some embodiments, the plurality of pre-defined mask cuts and the plurality of reusable mask cuts may be located on a same cut mask. In other embodiments, the plurality of pre-defined mask cuts and the plurality of reusable mask cuts may be located on separate cut mask (e.g., in a cut double patterning process)

At 1008, metal wires are re-routed on the plurality of design levels to intersect reusable mask cuts. In some positions, where the reusable mask cuts are available on a given design level, the re-routed metal wires may intersect the reusable mask cuts, while in other positions the re-routed meal wires may not intersect the reusable mask cuts. In the areas where the metal wires intersect a reusable mask cut, a sub-resolution end-to-end space can be achieved. In areas where the metal wires do not intersect a reusable mask cut, the end-to-end space will be within the resolution achievable without the mask cuts.

Figure 11:
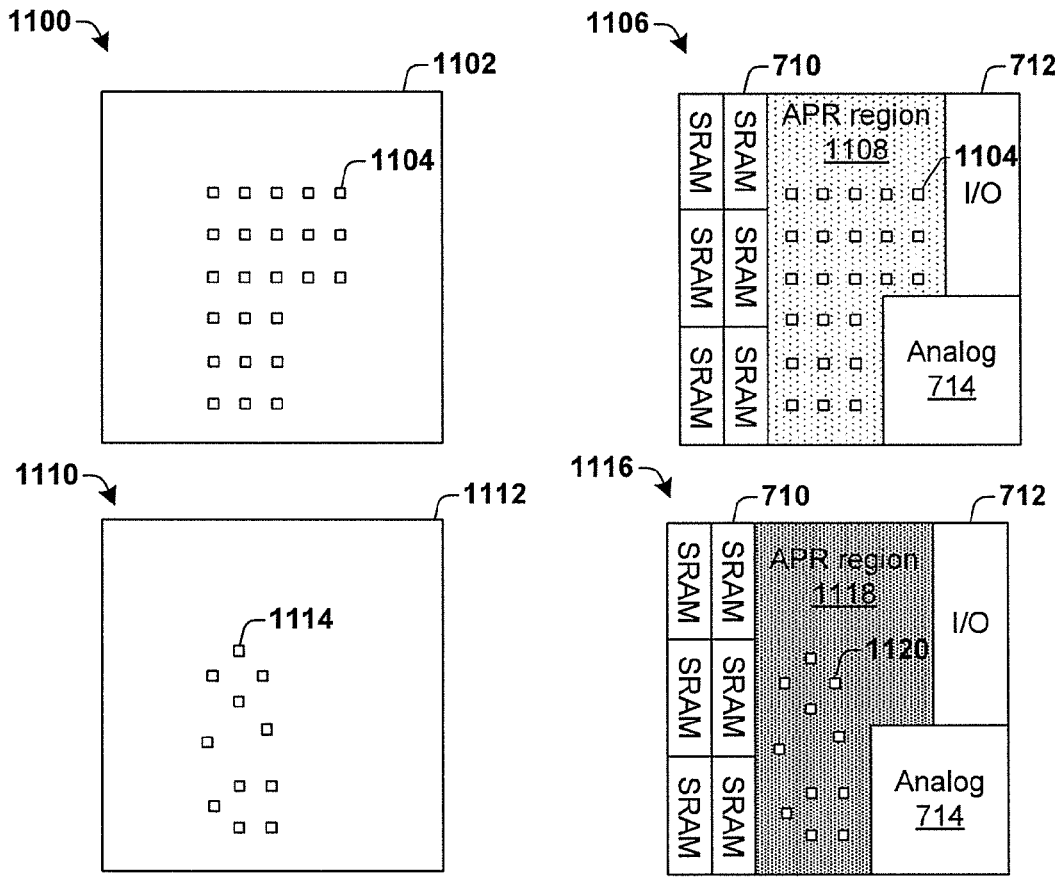
FIG. 11 illustrates some embodiments of IC layouts illustrating the formation of a reusable cut mask.

FIG. 11 illustrates some embodiments of top views, 1100, 1106, 1110, and 1116, of an integrated chip layout according to method 1000.

As illustrated in top view 1100, a plurality of pre-defined mask cuts 1104 are designed within a design space 1102 corresponding to a cut mask. The plurality of pre-defined mask cuts 1104 may be formed prior to placement of shapes within areas of design levels that the reusable cut mask will be used to form.

As illustrated in top view 1106, metal wires are routed on a plurality of design levels within a design area 1108 comprising the plurality of pre-defined mask cuts 1104. The metal wires are routed to intersect one or more of the plurality of pre-defined mask cuts 1104. In locations where metal wires intersect one or more of the plurality of predefined mask cuts 1104, a sub-resolution spacing (i.e., a spacing that is less than that which may be achieved using a single photomask) may be achieved between metal wires.

As illustrated in top view 1110, a plurality of reusable mask cuts 1114 are designed within a design space 1112 corresponding to a cut mask. In some embodiments, the plurality of reusable mask cuts 1114 may be designed at locations that intersect the metal wires and/or at locations that do not intersect the metal wires.

As illustrated in top view 1116, metal wires are re-routed on the plurality of design levels within design area 1118. The metal wires are re-routed to intersect one or more of the plurality of reusable mask cuts 1114. In the areas where re-routed metal wires intersect reusable mask cuts 1114, sub-resolution spacing can be achieved. In areas where the re-routed metal wires do not intersect reusable mask cuts 1114, the metal line spacing will be within the resolution achievable without the mask cuts.

Figure 12:
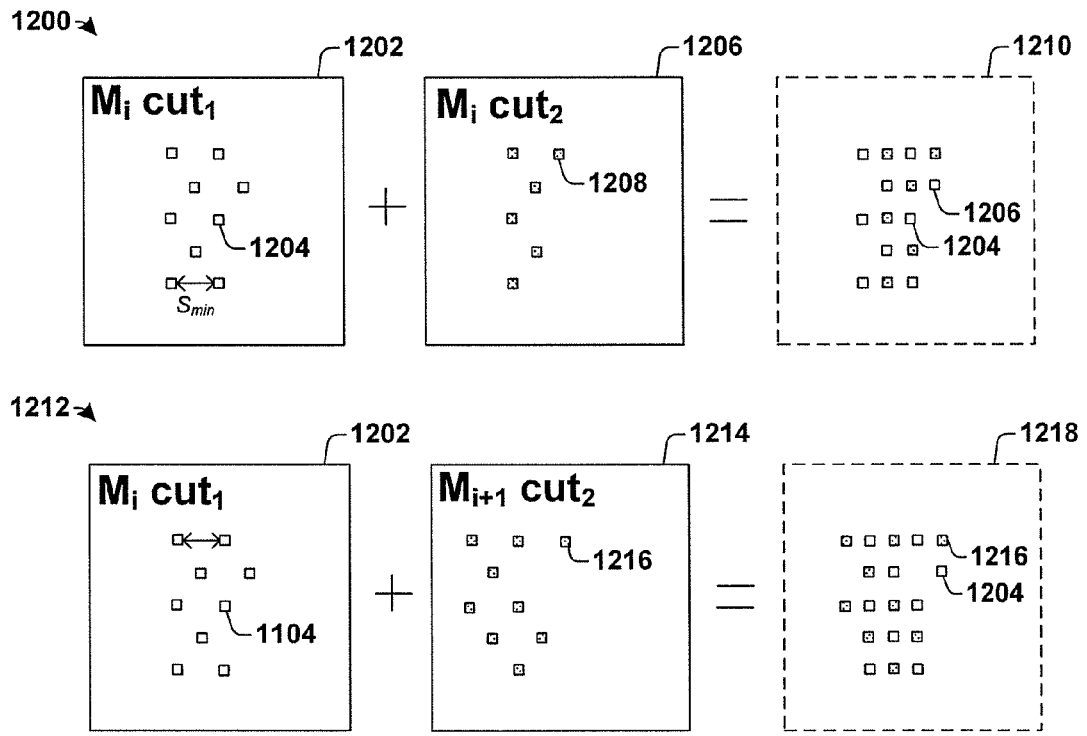
FIG. 12 illustrates a block diagram of some embodiments of a double cut mask set having a reusable cut mask.

It will be appreciated that the disclosed reusable cut mask is not limited a particular type of double patterning lithography but instead may be applied to any type of double patterning lithography process. In some embodiments, a disclosed reusable cut mask may be applied to a cut double patterning lithography process. For example, FIG. 12 illustrates some embodiments of cut masks sets that may be used to form a first design level and a second design level in a cut double patterning lithography process.

A first cut mask set 1200 may be used to form a first design level. The first cut mask set 1200 comprises a first cut mask 1202 having a first plurality of mask cuts 1204. The first plurality of mask cuts 1204 are spaced apart from one another at a minimum spacing $S_{min}$. The first cut mask set 1200 further comprises a second cut mask 1206 having a second plurality of mask cuts 1208. The second plurality of mask cuts 1208 may be located at positions between the first plurality of mask cuts 1202.

During a first double patterning lithography process, the first cut mask 1202 and the second cut mask 1206 are separately exposed to cut a pattern formed by one or more pattern masks (not shown). The resultant mask cuts of the pattern are the collective cuts of the first cut mask 1202 and the second cut mask 1206, as shown at 1210. Since the second plurality of mask cuts 1208 may be located at positions between the first plurality of cuts 1202, the first and second plurality of cut masks, 1204 and 1208, collectively provide for mask cuts that are spaced below the minimum spacing $S_{min}$, thereby providing a higher resolution through the use of the two cut masks, 1202 and 1206.

In some embodiments, one of the first cut mask 1202 or the second cut mask 1206 may comprise a reusable cut mask, while the other one of first cut mask 1202 or the second cut mask 1206 may comprise a non-reusable cut mask. For example, the first cut mask 1202 may comprise a reusable cut mask that can be used for a plurality of design levels, while the second cut mask 1206 may comprise a non-reusable cut mask. By using a non-reusable cut mask in the cut double patterning lithography process, the design freedom of the cut double patterning lithographic process is improved, while the cost is reduced due to the use of the reusable cut mask.

In some embodiments, a second cut mask set 1212, used to form a second design level, may comprise the reusable, first cut mask 1202 and a non-reusable third cut mask 1214. The reusable first cut mask 1202 comprises the first plurality of mask cuts 1204. The non-reusable third cut mask 1214 comprises a third plurality of mask cuts 1216. The third plurality of mask cuts 1216 may be located between the first plurality of mask cuts 1204, so that the first and third plurality of cut masks, 1204 and 1216, collectively provide for mask cuts that are spaced below the minimum spacing, as shown at 1216.

Figure 13:
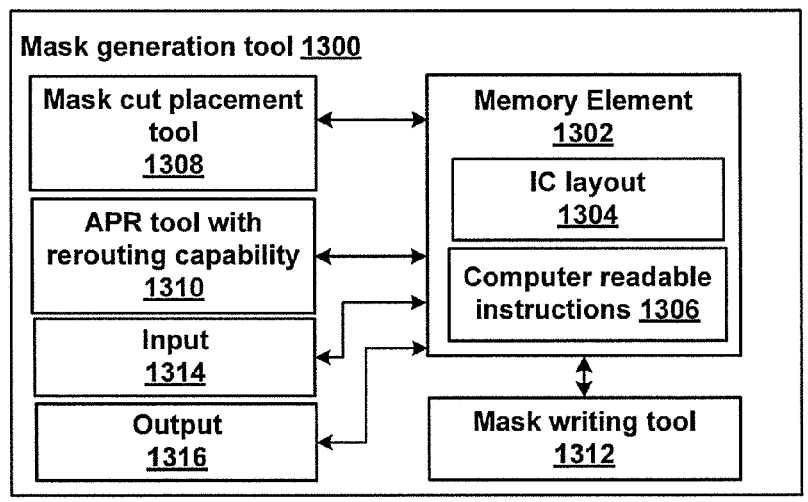
FIG. 13 illustrates a block diagram of some embodiments of a mask formation tool configured to form a reusable cut mask.

FIG. 13 illustrates some embodiments of a mask generation tool 1300 configured to generate a reusable cut mask or trim mask.

The mask generation tool 1300 comprises a memory element 1302. In various embodiments the memory element 1302 may comprise an internal memory or a computer readable medium. The memory element 1302 is configured to store an integrated chip (IC) layout 1304 having a plurality of design levels. In some embodiments, the memory element 1302 further comprises computer-executable instructions 1306. The computer readable instructions 1306 may provide for a method of operating one or more components of the mask generation tool according to a disclosed method (e.g., method 200, 300, 600, 800, or 1000).

The mask generation tool 1300 further comprises a mask cut placement tool 1308. The mask cut placement tool 1308 is configured to determine positions of a plurality of mask cuts within the IC layout 1304. In some embodiments, the mask cut placement tool 1308 may be configured to determine positions of pre-defined mask cuts, which are determined before routing of shapes is performed. In other embodiments, the mask cut placement tool 1308 is configured to determine positions of mask cuts after routing shapes has been performed.

The mask generation tool 1300 further comprises an automatic place and route tool 1310. The automatic place and route tool 1310 may be configured to determine the position of the one or more mask cuts within the IC layout 1304 and to selectively route shapes on a plurality of design levels with respect to the one or more mask cuts. In some embodiments, the automatic place and route tool 1310 may have re-routing capabilities, which allow the automatic place and route tool 1310 to route shapes on one or more design levels during a first time, to determine the position of one or more mask cuts, and then reroute shapes on the one or more design levels during a second time, after the first time.

In some embodiments, the mask generation tool 1300 may further comprise an input device 1312 and/or an output device 1314. The input device 1312 is configured to allow a user to interact with the integrated chip layout 1304 and in various embodiments may comprise a keyboard, mouse, and/or any other input device. The output device(s) 1314 is configured to provide a graphical representation of the integrated chip layout that can be viewed by a user. In various embodiments, the output device 1314 may comprise a monitor, for example.

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a method of forming a reusable cut mask or trim mask that can be used for multiple design levels, and an associated apparatus.

In some embodiments, the present disclosure relates to a method of generating data for mask sets on a plurality of design levels. The method comprises, determining positions of a plurality of mask cuts corresponding to a plurality of design levels for a reusable cut mask or a reusable trim mask. The method further comprises designing shapes on the plurality of design levels after determining positions of the plurality of mask cuts, wherein shapes on a respective design level are designed to intersect one or more of the plurality of mask cuts.

In other embodiments, the present disclosure relates to a method of performing a lithographic process. The method comprises generating a reusable cut mask or trim mask having a plurality of mask cuts that correspond to locations of mask cuts for a plurality of design levels. The method further comprises forming shapes on a first design level on a substrate by performing a first lithography patterning process according to a first pattern mask, and by performing a second lithography patterning process according to the reusable cut mask or trim mask. The method further comprises forming shapes on a second design level on the substrate by performing a third lithography patterning process according to a second pattern mask, and by performing a fourth lithography patterning process according to the reusable cut mask or trim mask.

In other embodiments, the present disclosure relates to a mask generation tool. The mask generation tool comprises a mask cut placement tool configured to determine positions of a plurality of mask cuts corresponding to a plurality of design levels for a reusable cut mask or a reusable trim mask. The mask generation tool further comprises an automatic place and routing tool configured to design shapes on the plurality of design levels after determining positions of the plurality of mask cuts, wherein shapes on a respective design level are designed to intersect one or more of the plurality of mask cuts.

What is claimed is:

1. A method of generating data for mask sets on a plurality of design levels, comprising:
   determining positions of a plurality of mask cuts corresponding to a plurality of design levels for a reusable cut mask or a reusable trim mask; and
   routing shapes on one or more of the plurality of design levels after determining the positions of the plurality of mask cuts, wherein the shapes intersect the previously determined positions of one or more of the plurality of mask cuts that separate the shapes into separate paths respectively configured to connect nodes of an integrated chip sharing an electrical network;
   wherein a computing device is configured to determine the positions of the plurality of mask cuts, or to route shapes.

2. The method of claim 1, further comprising forming shapes on a first design level using a cut multiple patterning lithography process comprising:
   exposing a substrate with the reusable cut mask having the plurality of mask cuts, and
   exposing the substrate with one or more non-reusable cut masks having one or more additional plurality of mask cuts.

3. The method of claim 1, wherein the plurality of design levels comprise a first metal interconnect layer and a second metal interconnect layer.

4. The method of claim 3, wherein designing shapes on the plurality of design levels comprises operating an automatic place and route tool to automatically route the shapes that intersect one or more of the plurality of mask cuts.

5. The method of claim 1, further comprising:
   generating a first mask set for a first design level, wherein the first mask set comprises a first pattern mask and the reusable cut mask; and
   generating a second mask set for a second design level, wherein the second mask set comprises a second pattern mask and the reusable cut mask.

6. The method of claim 1, further comprising:
   routing shapes with sub-resolution spaces, smaller than spaces that can be achieved within a single photomask, on the plurality of design levels;
   designing the plurality of mask cuts to after routing shapes with sub-resolution spaces, so that the plurality of mask cuts are located to form spaces at the sub-resolution spaces; and
   re-routing shapes on the plurality of design levels to intersect one or more of the plurality of mask cuts after determining the positions of the plurality of mask cuts.

7. The method of claim 1, further comprising:
   designing one or more of the plurality of mask cuts;
   routing shapes on the plurality of design levels to intersect the one or more of the plurality of mask cuts;
   designing a remainder of the plurality of mask cuts; and
   re-routing shapes on the plurality of design levels to intersect one or more of the remainder of the plurality of mask cuts.

8. A method of integrated chip processing, comprising:
   using a mask writing tool to generate a reusable cut mask or trim mask having a plurality of mask cuts that correspond to locations of mask cuts for a plurality of design levels;
   form shapes on a first design level over a substrate, by performing a first lithography patterning process according to a first pattern mask and performing a second lithography patterning process according to the reusable cut mask or trim mask; and
   forming shapes on a second design level that is different than the first design level over the substrate, by performing a third lithography patterning process according to a second pattern mask and performing a fourth lithography patterning process according to the reusable cut mask or trim mask.

9. The method of claim 8, further comprising forming shapes on the first design level or the second design level using a cut multiple patterning lithography process comprising:
   exposing the substrate with the reusable cut mask having the plurality of mask cuts, and
   exposing the substrate with one or more non-reusable cut masks having one or more additional plurality of mask cuts.

10. The method of claim 8, wherein the first design level comprises a first metal interconnect layer, and wherein the second design level comprises a second metal interconnect layer.

11. The method of claim 8, further comprising:
    depositing a cut material over the substrate at positions corresponding to the plurality of mask cuts prior to performing the first lithography or second patterning processes, wherein the cut material prevents formation of the shapes at positions in which the cut material is deposited.

12. The method of claim 8, further comprising:
routing shapes with sub-resolution spaces, smaller than spaces that can be achieved within a single photomask, as a continuous routing path on the plurality of design levels;
designing the plurality of mask cuts after routing shapes with sub-resolution spaces, wherein the plurality of mask cuts are located to intersect the continuous routing path at positions that form the sub-resolution spaces that separate the routed shapes into separate shapes that respectively connect nodes of an integrated chip sharing an electrical network; and
re-routing shapes on the plurality of design levels to intersect one or more of the plurality of mask cuts after designing the plurality of mask cuts.

13. The method of claim 8, further comprising:
designing one or more of the plurality of mask cuts;
routing shapes on the plurality of design levels to intersect at least one of the one or more of the plurality of mask cuts to form sub-resolution spaces that separate the routed shapes into separate shapes that respectively connect nodes of an integrated chip sharing an electrical network;
designing a remainder of the plurality of mask cuts; and
re-routing shapes on the plurality of design levels to intersect at least one of the remainder of the plurality of mask cuts to form sub-resolution spaces that separate the re-routed shapes into separate shapes that respectively connect nodes of an integrated chip sharing an alternative electrical network.

14. The method of claim 8, wherein sub-resolution spaces in different design levels are aligned at same positions of the reusable cut mask.

15. A mask generation tool, comprising:
a mask cut placement tool configured to determine positions of a plurality of mask cuts corresponding to a plurality of design levels for a reusable cut mask or a reusable trim mask; and
an automatic place and routing tool configured to design shapes on the plurality of design levels after determining the positions of the plurality of mask cuts, wherein shapes on a respective design level are designed to intersect the previously determined positions of one or more of the plurality of mask cuts.

16. The mask generation tool of claim 15, further comprising:
a memory element configured to store an integrated chip layout having the plurality of design levels; and
a mask writing tool configured to generate a mask set, based upon the integrated chip layout, comprising the reusable cut mask and a pattern mask.

17. The mask generation tool of claim 16, wherein the mask set further comprises:
a non-reusable cut mask having a second plurality of mask cuts corresponding to one of the plurality of design levels.

18. The mask generation tool of claim 15, wherein the plurality of design levels comprise a first metal interconnect layer and a second metal interconnect layer.

19. The mask generation tool of claim 15,
wherein the an automatic place and routing tool is configured to:
route shapes with sub-resolution spaces, smaller than spaces that can be achieved within a single photomask, as a continuous routing path on the plurality of design levels;
re-route shapes on the plurality of design levels to intersect one or more of the plurality of mask cuts after determining the positions of the plurality of mask cuts; and
wherein the mask cut placement tool is configured to design the plurality of mask cuts to after routing shapes with sub-resolution spaces, wherein the plurality of mask cuts are located to intersect the continuous routing path at positions that form sub-resolution spaces that separate the routed shapes into separate shapes that respectively connect nodes of an integrated chip sharing an electrical network.

20. The mask generation tool of claim 15,
wherein the mask cut placement tool is configured to:
design one or more of the plurality of mask cuts;
design a remainder of the plurality of mask cuts;
wherein the an automatic place and routing tool us configured to:
route shapes on the plurality of design levels to intersect at least one of the one or more of the plurality of mask cuts to form sub-resolution spaces that separate the routed shapes into separate shapes that respectively connect nodes of an integrated chip sharing an electrical network; and
re-route shapes on the plurality of design levels to intersect one or more of the remainder of the plurality of mask cuts to form sub-resolution spaces that separate the re-routed shapes into separate shapes that respectively connect the nodes of the integrated chip.

* * * * *